United States Patent
Hase et al.

(10) Patent No.: US 9,112,140 B2
(45) Date of Patent: Aug. 18, 2015

(54) MAGNETORESISTIVE EFFECT ELEMENT WITH AN OSCILLATION LAYER

(71) Applicant: KABUSHIKI KAISHA TOSHIBA, Minato-ku, Tokyo (JP)

(72) Inventors: Naoki Hase, Tokyo (JP); Masayuki Takagishi, Tokyo (JP); Hitoshi Iwasaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/157,879

(22) Filed: Jan. 17, 2014

(65) Prior Publication Data
US 2014/0204487 A1 Jul. 24, 2014

(30) Foreign Application Priority Data
Jan. 21, 2013 (JP) ................................. 2013-008689

(51) Int. Cl.
| | |
|---|---|
| G11B 5/39 | (2006.01) |
| H01L 43/08 | (2006.01) |
| G01R 33/09 | (2006.01) |
| G11B 5/00 | (2006.01) |

(52) U.S. Cl.
CPC .............. *H01L 43/08* (2013.01); *G01R 33/093* (2013.01); *G01R 33/098* (2013.01); *G11B 5/3906* (2013.01); *G11B 5/3932* (2013.01); *G11B 2005/0024* (2013.01)

(58) Field of Classification Search
USPC .......... 360/125.3, 324, 324.1, 324.11, 324.12
See application file for complete search history.

(56) References Cited

U.S. PATENT DOCUMENTS

| | | | | |
|---|---|---|---|---|
| 7,298,597 | B2 * | 11/2007 | Carey et al. ................. | 360/324.2 |
| 7,860,351 | B2 * | 12/2010 | Yagami .......................... | 382/325 |
| 7,957,098 | B2 * | 6/2011 | Yamada et al. ............ | 360/125.3 |
| 8,164,861 | B2 * | 4/2012 | Braganca et al. ............ | 360/313 |
| 8,194,361 | B2 * | 6/2012 | Kudo et al. ................ | 360/324.11 |
| 8,320,080 | B1 * | 11/2012 | Braganca et al. ............. | 360/128 |
| 8,902,544 | B2 * | 12/2014 | Braganca et al. .......... | 360/125.3 |
| 2009/0225465 | A1 * | 9/2009 | Iwasaki et al. .................. | 360/75 |

FOREIGN PATENT DOCUMENTS

JP 2010-192687 9/2010

OTHER PUBLICATIONS

Partial English computer translation of Sasaki et al. (JP 2010-192687), 10 pages.*

(Continued)

*Primary Examiner* — Brian Miller
(74) *Attorney, Agent, or Firm* — Nixon & Vanderhye, P.C.

(57) ABSTRACT

According to one embodiment, a magnetoresistive effect element includes: a nonmagnetic layer; a stacked structure body; and a detection layer. The stacked structure body is provided on the nonmagnetic layer. The stacked structure body includes: a reference layer; an oscillation layer; and an intermediate layer. The reference layer is provided on the nonmagnetic layer. A magnetization of the reference layer is fixed. The oscillation layer is provided on the reference layer. A magnetization of the oscillation layer is substantially parallel to the magnetization of the reference layer and is variable. The intermediate layer is provided between the reference layer and the oscillation layer. The detection layer is provided on the nonmagnetic layer apart from the stacked structure body.

16 Claims, 7 Drawing Sheets

(56) References Cited

OTHER PUBLICATIONS

Office Action dated Mar. 26, 2014 in counterpart JP Application No. 2013-008689 and English-language translation thereof.

K. Ando et al., "Optimum Condition for Spin-Current Generation from Magnetization Precession in Thin Film Systems", Applied Physics Letters 94, Apr. 2009, 3 pages.

* cited by examiner

MAGNETORESISTIVE EFFECT ELEMENT WITH AN OSCILLATION LAYER

CROSS-REFERENCE TO RELATED APPLICATIONS

This application is based upon and claims the benefit of priority from Japanese Patent Application No. 2013-008689, filed on Jan. 21, 2013; the entire contents of which are incorporated herein by reference.

FIELD

Embodiments described herein relate generally to a magnetoresistive effect element, a magnetic head, a magnetic head assembly, and a magnetic recording and reproducing apparatus.

BACKGROUND

A magnetoresistive effect element is used for a magnetic head (for example, an MR head; a magnetoresistive head). The MR head is mounted on a magnetic recording and reproducing apparatus, and reads information from a magnetic recording medium such as a hard disk drive. To enhance the performance (recording density) of the hard disk, a technology utilizing the spin accumulation effect is desired as a high resolution reproducing head. In the technology utilizing the spin accumulation effect, there is room for improvement of the deficiency in the output voltage and spin injection efficiency.

DETAILED DESCRIPTION

In general, according to one embodiment, a magnetoresistive effect element includes: a nonmagnetic layer; a stacked structure body; and a detection layer. The stacked structure body is provided on the nonmagnetic layer. The stacked structure body includes: a reference layer; an oscillation layer; and an intermediate layer. The reference layer is provided on the nonmagnetic layer. A magnetization of the reference layer is fixed. The oscillation layer is provided on the reference layer. A magnetization of the oscillation layer is parallel to the magnetization of the reference layer and is variable. The intermediate layer is provided between the reference layer and the oscillation layer. The detection layer is provided on the nonmagnetic layer apart from the stacked structure body.

Hereinbelow, embodiments of the invention are described with reference to the drawings.

The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

In the specification of this application and the drawings, components similar to those described in regard to a drawing thereinabove are marked with the same reference numerals, and a detailed description is omitted as appropriate.

Figures 1A, 1B:
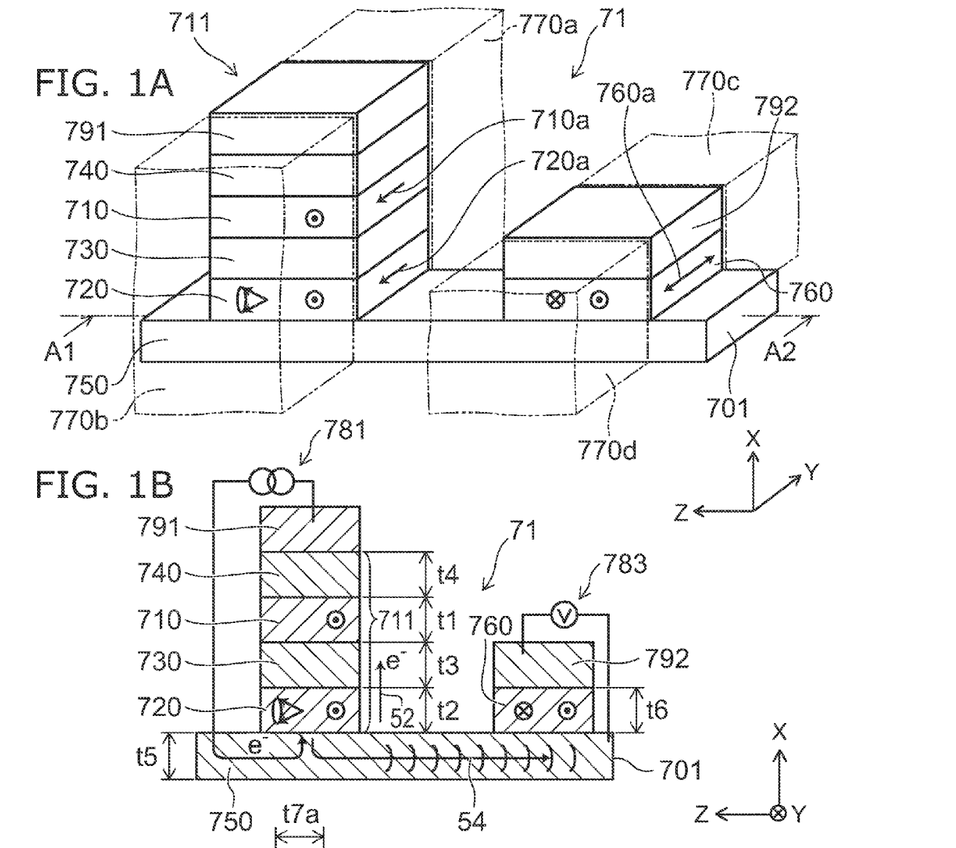
FIG. 1A to FIG. 1C are schematic views illustrating a magnetoresistive effect element according to an embodiment.
Figure 1C:
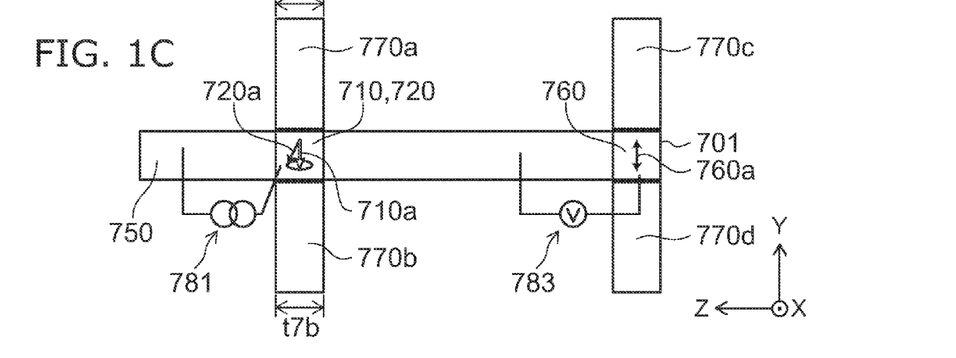

FIG. 1A to FIG. 1C are schematic views illustrating a magnetoresistive effect element according to an embodiment.

FIG. 1A is a schematic perspective view. FIG. 1B is a cross-sectional view taken along line A1-A2 shown in FIG. 1A. FIG. 1C is a schematic plan view.

Figure 2:
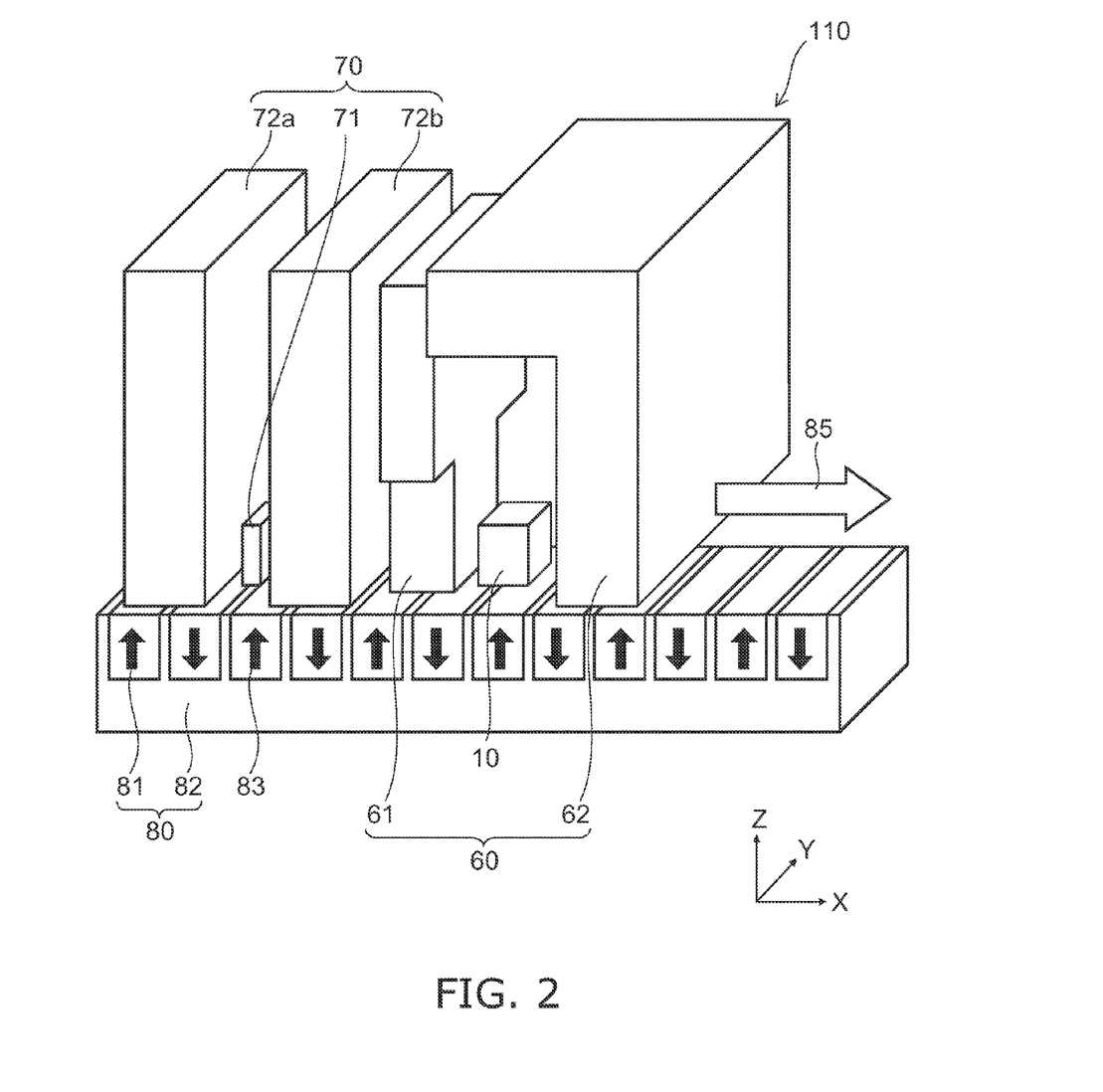
FIG. 2 is a schematic perspective view illustrating a magnetic head according to the embodiment.

FIG. 2 is a schematic perspective view illustrating a magnetic head according to the embodiment.

Figure 3:
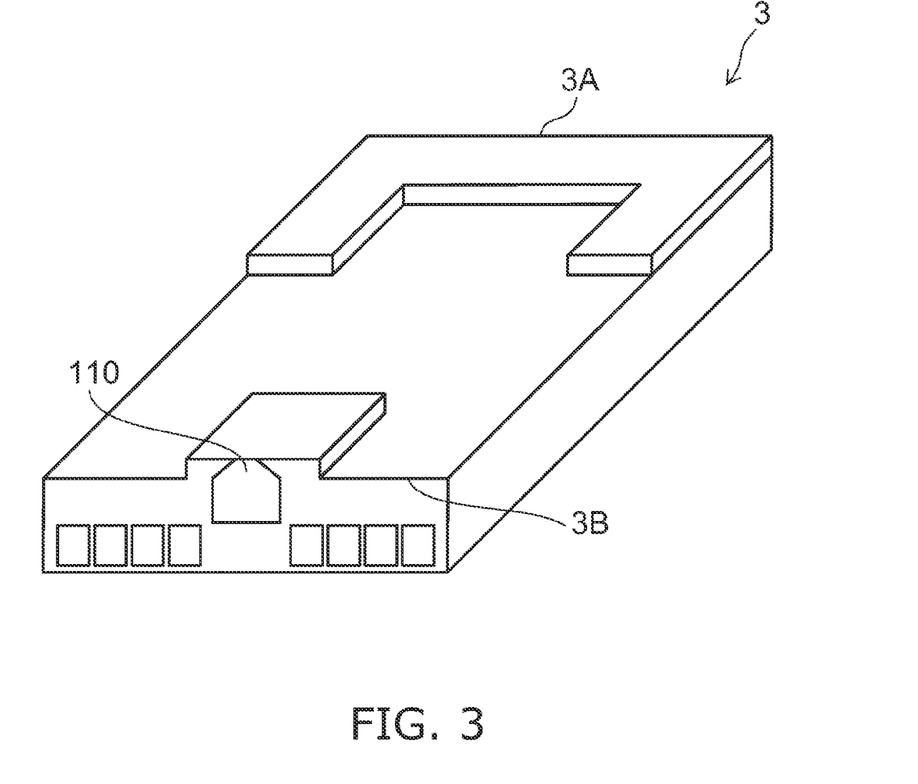
FIG. 3 is a schematic perspective view illustrating a head slider in which the magnetic head according to the embodiment is mounted.

FIG. 3 is a schematic perspective view illustrating a head slider in which the magnetic head according to the embodiment is mounted.

First, an overview of the configuration and an overview of the operation of the magnetic head according to the embodiment are described using FIG. 2 and FIG. 3.

As shown in FIG. 2, a magnetic head 110 includes a reproducing unit 70 (a reproducing head unit). The magnetic head 110 may further include a writing unit 60 (a writing head unit).

The writing unit 60 includes, for example, a main magnetic pole 61 and a return path (shield) 62. In the magnetic head 110, the writing unit 60 may further include a portion serving to assist the writing process, such as a spin torque oscillator 10. That is, the writing unit 60 of the magnetic head 110 may have an arbitrary configuration.

The reproducing unit 70 includes a magnetoresistive effect element 71, a first magnetic shield 72a, and a second magnetic shield 72b. The magnetoresistive effect element 71 is provided between the first magnetic shield 72a and the second magnetic shield 72b. The first magnetic shield 72a and the second magnetic shield 72b are provided as necessary, and may be omitted depending on circumstances.

The components of the reproducing unit 70 mentioned above and the components of the writing unit 60 mentioned above are separated by, for example, a not-shown insulator such as alumina.

As shown in FIG. 3, the magnetic head 110 is mounted in a head slider 3. $Al_2O_3$/TiC or the like, for example, is used for the head slider 3.

The head slider 3 moves relative to a magnetic recording medium 80 such as a magnetic disk while flying above or being in contact with the magnetic recording medium 80.

The head slider 3 has, for example, an air inflow side 3A and an air outflow side 3B. The magnetic head 110 is disposed at the side surface on the air outflow side 3B of the head slider 3 or the like. Thereby, the magnetic head 110 mounted in the head slider 3 moves relative to the magnetic recording medium 80 while flying above or being in contact with the magnetic recording medium 80.

As shown in FIG. 2, the magnetic recording medium 80 includes, for example, a medium substrate 82 and a magnetic recording layer 81 provided on the medium substrate 82. The magnetization 83 of the magnetic recording layer 81 is controlled by a magnetic field applied from the writing unit 60, and thereby the writing operation is performed. At this time, the magnetic recording medium 80 moves relative to the magnetic head 110 along a medium moving direction 85.

The reproducing unit 70 is disposed to oppose the magnetic recording medium 80. The magnetic recording medium 80 moves relative to the magnetic head 110 along the medium moving direction 85, and the reproducing unit 70 detects the direction of the magnetization 83 of the magnetic recording layer 81. Thereby, the reproducing operation is performed.

FIG. 1A to FIG. 1C illustrate the magnetoresistive effect element 71 according to the embodiment.

In the drawings, the first magnetic shield 72a and the second magnetic shield 72b are omitted. In FIG. 1A, a current input terminal 781 and a voltmeter 783 are omitted.

The magnetoresistive effect element 71 has a medium facing surface 701 (ABS; air bearing surface) opposed to the magnetic recording medium 80. The medium facing surface 701 is an end surface of a first nonmagnetic layer 750 described later and is an end surface opposed to the magnetic recording medium 80. The magnetoresistive effect element 71 detects the direction of the magnetization 83 recorded in the magnetic recording medium 80.

The magnetoresistive effect element 71 includes a stacked structure body (spin injection terminal) 711, a first nonmagnetic layer 750, a detection layer (third ferromagnetic layer) 760, a first electrode layer 791, and a second electrode layer 792. The stacked structure body 711 includes a reference layer (first ferromagnetic layer) 710, an oscillation layer (second ferromagnetic layer) 720, an intermediate layer (second nonmagnetic layer) 730, and an antiferromagnetic layer 740. The antiferromagnetic layer 740 is provided on the first nonmagnetic layer 750 along a first direction parallel to the medium facing surface 701. The oscillation layer 720 is provided between the antiferromagnetic layer 740 and the first nonmagnetic layer 750. The intermediate layer 730 is provided between the antiferromagnetic layer 740 and the oscillation layer 720. The reference layer 710 is provided between the antiferromagnetic layer 740 and the intermediate layer 730. The detection layer 760 is provided apart from the stacked structure body 711 along a second direction perpendicular to the medium facing surface 701. The detection layer 760 is provided apart from the stacked structure body 711 along the direction from the stacked structure body 711 toward the medium facing surface 701. In the magnetoresistive effect element 71 shown in FIG. 1A and FIG. 1B, the detection layer 760 is provided on the first nonmagnetic layer 750 along the first direction.

Here, the direction from the oscillation layer 720 toward the reference layer 710 is defined as the X-axis direction. The direction perpendicular to the medium facing surface 701 is defined as the Z-axis direction. The direction perpendicular to the X-axis direction and perpendicular to the Z-axis direction is defined as the Y-axis direction.

In the embodiment, the X-axis direction is parallel to the medium facing surface 701. At this time, "parallel" includes not only the case where the X-axis direction and the medium facing surface 701 are strictly parallel but also the case where the X-axis direction is inclined with respect to the medium facing surface 701 at a small angle. For example, the X-axis direction may be inclined with respect to the medium facing surface 701 at plus or minus 10 degrees or less.

The X-axis direction coincides with the first direction.

The X-axis direction runs along the down track direction (the medium moving direction 85), for example. The Y-axis direction runs along the cross track direction (the track width direction), for example. The writing unit 60 is aligned with the reproducing unit 70 along the X-axis direction, for example. The medium moving direction 85 may be inclined with respect to the X-axis direction at plus or minus 20 degrees or less depending on the relative position of the magnetic recording medium 80 on which reproduction is performed, for example. Thus, "run along" at this time includes not only the case where the X-axis direction (the direction from the oscillation layer 720 toward the reference layer 710) is strictly parallel to the medium moving direction 85 but also the case where it is inclined at plus or minus 20 degrees or less, for example.

In the specification of this application, "provided on" includes not only the case where an upper layer is provided in contact with a lower layer but also the case where an upper layer is provided on a lower layer via another layer.

In the specification of this application, "stack" includes not only the state where a plurality of layers are stacked in contact with one another but also the case where a plurality of layers are stacked via other components.

The direction of the magnetization of the reference layer 710 (a first magnetization 710a) is fixed by the antiferromagnetic layer 740.

The direction of the magnetization of the oscillation layer 720 (a second magnetization 720a) is the same direction as the first magnetization 710a. In other words, the direction of the second magnetization 720a is parallel to the direction of the first magnetization 710a. The direction of the magnetization of the oscillation layer 720 is variable. At this time, "parallel" includes not only the case where the direction of the first magnetization 710a is strictly parallel to the direction of the second magnetization 720a but also the case where the angle between the direction of the first magnetization 710a and the direction of the second magnetization 720a is plus or minus 50 degrees or less (reference document: Applied Physics Letters 94, 152509 (2009)).

In the magnetoresistive effect element 71 shown in FIG. 1A to FIG. 1C, the direction of the first magnetization 710a is antiparallel to the Y-axis direction. The direction of the second magnetization 720a is antiparallel to the Y-axis direction. The angle between the direction of the first magnetization 710a and the Y-axis direction may be plus or minus 20 degrees or less, for example. The angle between the direction of the second magnetization 720a and the Y-axis direction may be plus or minus 20 degrees or less, for example.

However, the embodiment is not limited thereto, and the direction of the first magnetization 710a may be parallel to the Y-axis direction, parallel or antiparallel to the Z-axis direction, or parallel or antiparallel to the X-axis direction, for example. The direction of the second magnetization 720a may be parallel to the Y-axis direction, parallel or antiparallel to the Z-axis direction, or parallel or antiparallel to the X-axis direction, for example.

The oscillation layer 720 can make magnetization precession freely. In other words, the second magnetization 720a can precess and oscillate. The second magnetization 720a precesses when a current flows through the oscillation layer 720. In other words, the second magnetization 720a does not precess when no current flows through the oscillation layer 720.

The direction of the magnetization of the detection layer 760 is variable. The easy axis of the magnetization of the detection layer 760 (a magnetization easy axis 760a) is parallel to the direction of the first magnetization 710a. The easy axis of the magnetization of the detection layer 760 (the magnetization easy axis 760a) is parallel to the direction of the second magnetization 720a. At this time, "parallel" includes not only the case where the magnetization easy axis 760a is strictly parallel to the direction of the first magnetization 710a but also the case where the angle between the magnetization easy axis 760a and the direction of the first magnetization 710a is plus or minus 20 degrees or less. At this time, "parallel" includes not only the case where the magnetization easy axis 760a is strictly parallel to the direction of the second magnetization 720a but also the case where the angle between the magnetization easy axis 760a and the direction of the second magnetization 720a is plus or minus 20 degrees or less.

As shown in FIG. 1A and FIG. 1C, the magnetoresistive effect element 71 includes a first hard bias 770a and a second hard bias 770b. The first hard bias 770a is apart from the second hard bias 770b in the Y-axis direction. The stacked structure body 711 is provided between the first hard bias 770a and the second hard bias 770b. The first nonmagnetic layer 750 is provided between the first hard bias 770a and the second hard bias 770b. The first hard bias 770a and the second hard bias 770b can set the direction of the second magnetization 720a to the same direction as the first magnetization 710a.

As shown in FIG. 1A and FIG. 1C, the magnetoresistive effect element 71 includes a third hard bias 770c and a fourth hard bias 770d. The third hard bias 770c is apart from the fourth hard bias 770d in the Y-axis direction. The detection layer 760 is provided between the third hard bias 770c and the fourth hard bias 770d. The first nonmagnetic layer 750 is provided between the third hard bias 770c and the fourth hard bias 770d. The third hard bias 770c and the fourth hard bias 770d can set the direction of the magnetization easy axis 760a of the detection layer 760 to a direction parallel to the medium facing surface 701.

For the reference layer 710, for example, Fe, Co, Ni, an FeCo alloy, an FeNi alloy, a ferromagnetic alloy in which Co is added to Fe, Ni, Mn, Al, Si, or Ge, a ferromagnetic Heusler alloy whereby the average composition of the reference layer 710 is made $Co_2AB$ (A: Fe, Mn, or both Fe and Mn being included; B: Al, Si, or Ge being included), and the like are used. The atomic composition of the average composition $Co_2AB$ of the reference layer 710 includes not only the stoichiometric composition in which Co:A:B=50:25:25 (at %) but also compositions in which Co, A, and B are deviated from the stoichiometric composition within a range of plus or minus 5 at %. For example, the atomic composition of the average composition $Co_2AB$ of the reference layer 710 may be a stoichiometric composition in which Co:A:B=45:25:30 (at %) or the like. The reference layer 710 may have a stacked structure or a single-layer structure of an alloy to the extent that the average composition is in the range described above. The material of the oscillation layer 720 and the detection layer 760 is similar to the material of the reference layer 710.

For the antiferromagnetic layer 740, for example, an antiferromagnetic material such as PtMn, PdPtMn, IrMn, and RuRhMn is used.

For the intermediate layer 730, for example, Cu, Ag, Al, or Au or an alloy of these is used. For the first nonmagnetic layer 750, for example, Cu, Ag, Al, or Au or an alloy of these is used.

The thickness t1 (the length along the X-axis direction) of the reference layer 710 is not less than 2 nanometers (nm) and not more than 20 nm, for example. The thickness t2 (the length along the X-axis direction) of the oscillation layer 720 is not less than 2 nm and not more than 10 nm, for example. The thickness t6 (the length along the X-axis direction) of the detection layer 760 is not less than 2 nm and not more than 20 nm, for example.

The thickness t4 (the length along the X-axis direction) of the antiferromagnetic layer 740 is not less than 5 nm and not more than 10 nm, for example. The thickness t3 (the length along the X-axis direction) of the intermediate layer 730 is not less than 2 nm and not more than 5 nm, for example. The thickness t5 (the length along the X-axis direction) of the first nonmagnetic layer 750 is not less than 2 nm and not more than 15 nm, for example.

As shown in FIG. 1B and FIG. 1C, the magnetoresistive effect element 71 includes a current input terminal 781 and a voltmeter 783. One end of the current input terminal 781 is connected to the first electrode layer 791 provided on the antiferromagnetic layer 740 of the stacked structure body 711. The other end of the current input terminal 781 is connected to the first nonmagnetic layer 750. One end of the voltmeter 783 is connected to the second electrode layer 792 provided on the detection layer 760. The other end of the voltmeter 783 is connected to the first nonmagnetic layer 750. For the first electrode layer 791 and the second electrode layer 792, for example, Cu, Ta, Ru, Ag, Au, Al, or W, a stacked structure of these, or an alloy containing one of these is used.

When, for example, a current is passed from the current input terminal 781 so that electrons flow in the direction of arrow 52 shown in FIG. 1B, electrons whose spin is polarized (spin-polarized electrons) are injected from the reference layer 710 into the first nonmagnetic layer 750. The spin-polarized electrons injected in the first nonmagnetic layer 750 diffuse in the first nonmagnetic layer 750 from the stacked structure body 711 toward the detection layer 760 due to the spin accumulation effect, as illustrated by arrow 54 shown in FIG. 1B.

At this time, the "spin accumulation effect" is a phenomenon in which due to a current inputted from one ferromagnetic layer toward a nonmagnetic layer, spin-polarized electrons are injected into the nonmagnetic layer and polarized spins are accumulated in the spin diffusion length of the nonmagnetic layer (the distance at which the information of the spin disappears). A ferromagnetic material is spin-polarized near the Fermi level. Therefore, when the potential difference between the other ferromagnetic layer and the nonmagnetic layer is detected, a voltage difference occurs in accordance with the difference between the magnetization direction of the one ferromagnetic layer and the magnetization direction of the other ferromagnetic layer. The voltage difference serves as the output voltage caused by spin accumulation.

In the magnetoresistive effect element 71 shown in FIG. 1A to FIG. 1C, due to a current inputted from the reference layer 710 toward the first nonmagnetic layer 750, spin-polarized electrons are injected into the first nonmagnetic layer 750. Polarized spins are accumulated in the spin diffusion length of the first nonmagnetic layer 750. The reference layer 710 is spin-polarized near the Fermi level. Therefore, when the potential difference between the detection layer 760 and the first nonmagnetic layer 750 is detected by the voltmeter 783, a voltage difference occurs in accordance with the difference between the direction of the magnetization of the reference layer 710 (the first magnetization 710a) and the direction of the magnetization of the detection layer 760. The voltage difference serves as the output voltage caused by spin accumulation.

Here, a reference example is described.

The recording density of magnetic recording and reproducing apparatuses is expected to further increase beyond Tbit/$in^2$ (terabit/square inch) in the near future. To cope with this, a magnetic reproducing head capable of ensuring sufficient resolution and reproduction output is required. However, for example, in a TMR (tunneling magneto-resistance) head or a CPP-GMR (current-perpendicular-to-plane giant magneto-resistance) head as a current-perpendicular-to-plane magnetic head of a reference example, the gap length between shields is approximately 20 nm (nanometers) or less when the recording density is in the Tbit range. This gap length may make it difficult to obtain sufficient reproduction output and resolution.

In view of this, a head utilizing the spin accumulation effect described above is proposed as a high resolution reproducing head. In general, in a spin accumulation magnetoresistive element, a magnetization fixed layer is used as a spin injection terminal, and a magnetization free layer is used as a detection layer. As a means for increasing the output voltage, increasing the injection amount of polarized spins using a ferromagnetic layer with a large spin polarization rate is given. As another means, a method in which a nonmagnetic high resistance layer for interface resistance adjustment is interposed at the interface between a ferromagnetic layer and a nonmagnetic layer is given. As still another means, using a material with a long spin diffusion length as a nonmagnetic layer is given. As yet another means, suppressing the relaxation of injected spins by shortening the distance between two ferromagnetic layers is given.

However, a deficiency in the output voltage is an issue with the spin accumulation magnetoresistive element according to the reference example. Another issue with the spin accumulation magnetoresistive element according to the reference example is that when a high resistive interface layer is interposed at the interface between a magnetization fixed layer and a nonmagnetic layer, the spin injection derived from a current may experience a reduction in spin injection efficiency due to resistance mismatches with the ferromagnetic layer and the nonmagnetic layer.

In contrast, in the magnetoresistive effect element 71 according to the embodiment, the oscillation layer 720 is provided between the reference layer 710 and the first nonmagnetic layer 750. When, for example, a current is passed from the current input terminal 781 so that electrons flow in the direction of arrow 52 shown in FIG. 1B, spin injection from the oscillation layer 720 into the first nonmagnetic layer 750 is made due to the spin pumping effect based on the precession of the magnetization of the oscillation layer 720 (the second magnetization 720a). The spin injection system using spin pumping is the transfer of the spin angular momenta of electrons based on the precession of the magnetization, which is different from a system accompanied by a current. Therefore, even when a high resistive first interface layer 780a shown in FIG. 4A and FIG. 4B, for example, is interposed between the oscillation layer 720 and the first nonmagnetic layer 750 and the mismatch between the resistance of the oscillation layer 720 and the resistance of the first interface layer 780a is large, spin injection by spin pumping from the oscillation layer 720 into the first nonmagnetic layer 750 is made with good efficiency.

That is, of the electrons that have passed through the oscillation layer 720, electrons having a spin in the same direction as the direction of the magnetization of the reference layer 710 (the first magnetization 710a) pass through the reference layer 710. On the other hand, electrons having a spin in the opposite direction to the direction of the first magnetization 710a are reflected at the interface between the intermediate layer 730 and the reference layer 710. Thus, the electrons having a spin in the opposite direction to the direction of the first magnetization 710a flow into the oscillation layer 720. The spin angular momenta of the electrons are transferred to the magnetization of the oscillation layer 720. Accordingly, spin torque acts on the magnetization of the oscillation layer 720. The direction of the spin torque is the opposite direction to the direction of the magnetization of the reference layer 710. Consequently, the magnetization of the oscillation layer 720 precesses and oscillates.

Thus, for example, when a current is passed from the current input terminal 781 so that electrons flow in the direction of arrow 52 shown in FIG. 1B, spin injection by the current (the flow of electrons) (current-derived spin injection) and spin injection by the spin pumping of the oscillation layer 720 are made substantially at the same time. Therefore, the amount of spin injection from the stacked structure body 711 into the first nonmagnetic layer 750 can be increased to increase the output voltage as compared to the case where the oscillation layer 720 is not provided.

It is preferable that the total of the amount of current-derived spin injection and the amount of spin injection by the spin pumping of the oscillation layer 720 be larger or at the maximum. In the embodiment, when the saturation magnetization of the reference layer 710 is denoted by Ms1 and the saturation magnetization of the oscillation layer 720 is denoted by Ms2, the product Ms1×t1 is larger than the product Ms2×t2. Thereby, the strength and weakness of the magnetostatic coupling produced between the reference layer 710 and the oscillation layer 720 can be adjusted. The oscillation layer 720 can make magnetization precession more easily at a larger angle than the reference layer 710.

When the saturation magnetization and the thickness (the length along the Z-axis direction) of the first hard bias 770a are denoted by Ms7a and t7a, respectively, and the saturation magnetization and the thickness (the length along the Z-axis direction) of the second hard bias 770b are denoted by Ms7b and t7b, respectively, the product Ms7a×t7a and the product Ms7b×t7b may be adjusted as appropriate. Thereby, the oscillation layer 720 can make magnetization precession still more easily at a still larger angle than the reference layer 710.

Figure 4A:
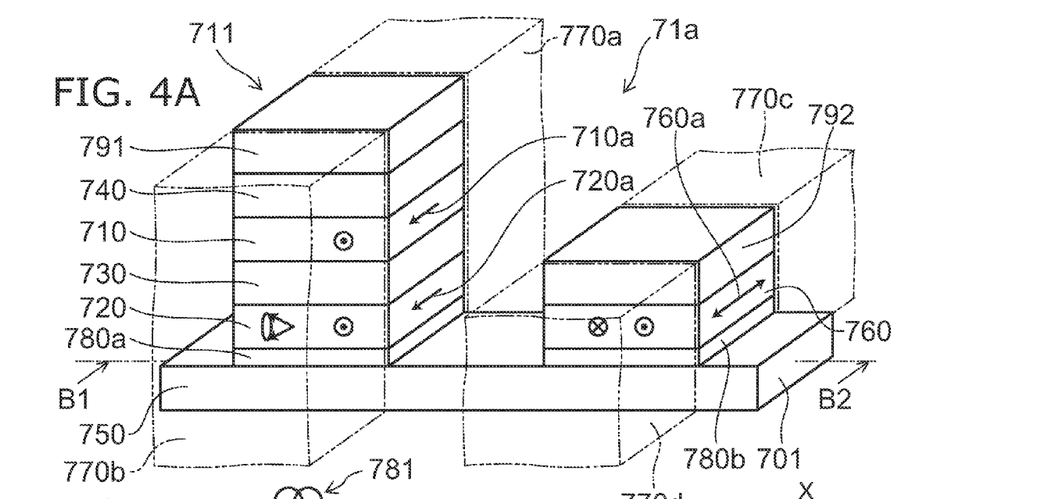
FIG. 4A to FIG. 4C are schematic views illustrating another magnetoresistive effect element according to the embodiment.
Figure 4B:
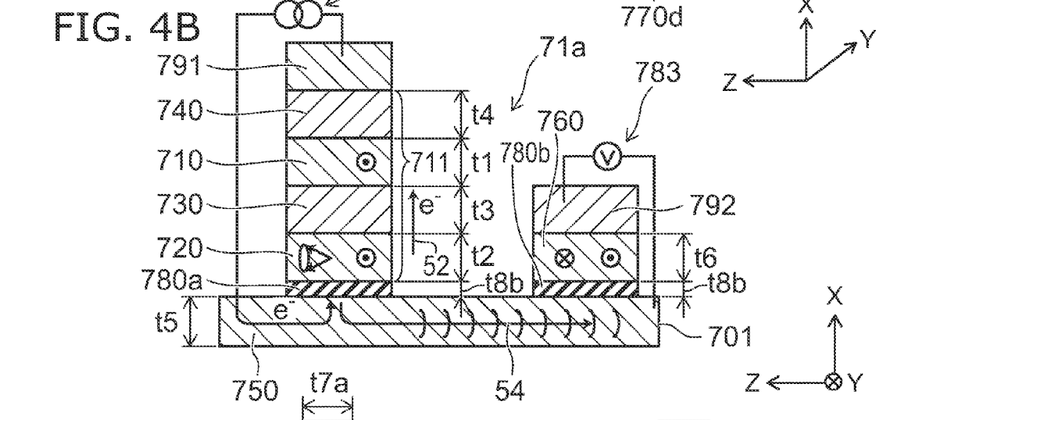
Figure 4C:
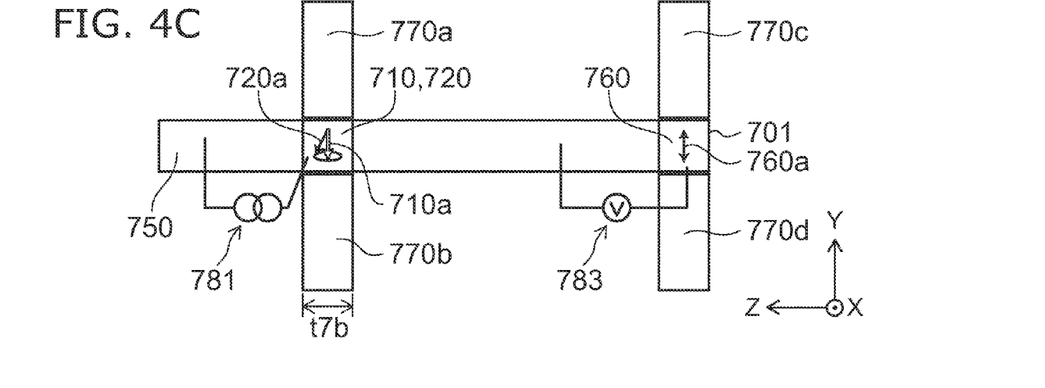

FIG. 4A to FIG. 4C are schematic views illustrating another magnetoresistive effect element according to the embodiment.

FIG. 4A is a schematic perspective view. FIG. 4B is a cross-sectional view taken along line B1-B2 shown in FIG. 4A. FIG. 4C is a schematic plan view.

In the drawings, the first magnetic shield 72a and the second magnetic shield 72b are omitted. In FIG. 4A, the current input terminal 781 and the voltmeter 783 are omitted.

A magnetoresistive effect element 71a shown in FIG. 4A to FIG. 4C further includes a first interface layer 780a and a second interface layer 780b as compared to the magnetoresistive effect element 71 shown in FIG. 1A to FIG. 1C. The first interface layer 780a is provided between the oscillation layer 720 and the first nonmagnetic layer 750. The second interface layer 780b is provided between the detection layer 760 and the first nonmagnetic layer 750.

For the first interface layer 780a, for example, an oxide of Al, Si, Mg, Ti, Cr, or Ga is used.

For the second interface layer 780b, for example, an oxide of Al, Si, Mg, Ti, Cr, or Ga is used.

The thickness t8a (the length along the X-axis direction) of the first interface layer 780a is not less than 0.5 nm and not more than 2 nm, for example.

The thickness t8b (the length along the X-axis direction) of the second interface layer 780b is not less than 0.5 nm and not more than 2 nm, for example.

Otherwise, the magnetoresistive effect element 71a is similar to the magnetoresistive effect element 71 described above in regard to FIG. 1A to FIG. 1C.

The first interface layer 780a sets the interface resistance between the oscillation layer 720 and the first nonmagnetic layer 750 to a higher resistance than in the case where the first interface layer 780a is not provided. In other words, the first interface layer 780a has a resistance higher than the interface resistance between the oscillation layer 720 and the first nonmagnetic layer 750. The second interface layer 780b sets the interface resistance between the detection layer 760 and the first nonmagnetic layer 750 to a higher resistance than in the case where the second interface layer 780b is not provided. In other words, the second interface layer 780b has a resistance higher than the interface resistance between the detection layer 760 and the first nonmagnetic layer 750.

Thereby, the voltage difference in accordance with the difference between the direction of the magnetization of the reference layer 710 (the first magnetization 710a) and the direction of the magnetization of the detection layer 760 can be made larger than in the case where the first interface layer 780a and the second interface layer 780b are not provided (e.g. the magnetoresistive effect element 71 shown in FIG. 1A to FIG. 1C). In other words, the output voltage caused by spin accumulation can be made larger.

On the other hand, the interface resistance is increased as compared to the case where the first interface layer 780a and the second interface layer 780b are not provided. Therefore, the current-derived spin injection may experience a reduction in spin injection efficiency due to resistance mismatches with a ferromagnetic layer (in this example, the reference layer 710) and a nonmagnetic layer (in this example, the first nonmagnetic layer 750).

In contrast, in the magnetoresistive effect element 71a according to the embodiment, the oscillation layer 720 is provided between the reference layer 710 and the first nonmagnetic layer 750. When, for example, a current is passed from the current input terminal 781 so that electrons flow in the direction of arrow 52 shown in FIG. 4B, spin injection from the oscillation layer 720 into the first nonmagnetic layer 750 is made due to the spin pumping effect based on the precession of the magnetization of the oscillation layer 720 (the second magnetization 720a).

It is preferable that the total of the amount of current-derived spin injection and the amount of spin injection by the spin pumping of the oscillation layer 720 be larger or at the maximum. In this example, the first interface layer 780a and the second interface layer 780b are provided. Thus, to make the total of the spin injection amounts larger or the maximum, it is preferable to increase the efficiency of spin current generation caused by the spin pumping of the oscillation layer 720. This is because the efficiency of spin injection by the spin pumping of the oscillation layer 720 is higher than the efficiency of current-derived spin injection as described above.

In the embodiment, the product Ms1×t1 is larger than the product Ms2×t2. Therefore, the projection area of the magnetization precession of the oscillation layer 720 is larger or at the maximum. In other words, the angle of the magnetization precession of the oscillation layer 720 is larger or at the maximum. Thus, the amount of spin injection by the spin pumping of the oscillation layer 720 can be made larger or the maximum.

The product Ms7a×t7a and the product Ms7b×t7b may be adjusted as appropriate. Thereby, the amount of spin injection by the spin pumping of the oscillation layer 720 can be made still larger or the maximum.

Figure 5A:
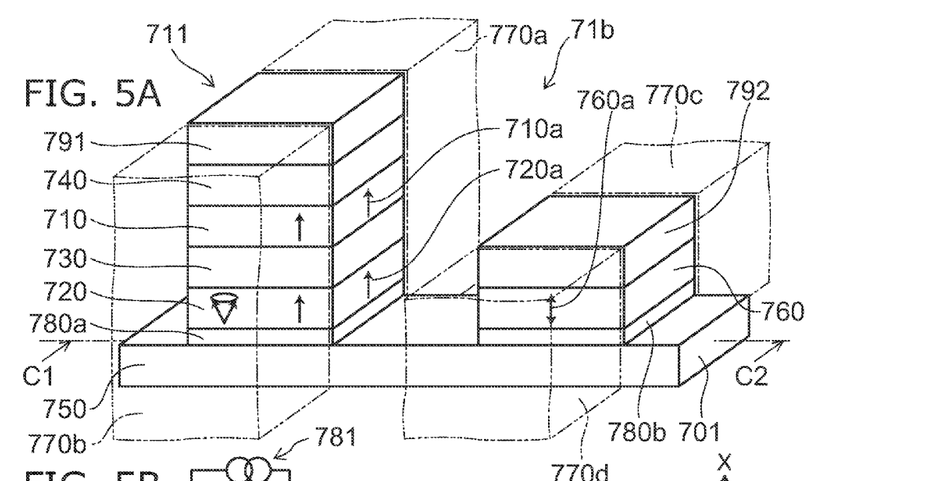
FIG. 5A to FIG. 5C are schematic views illustrating still another magnetoresistive effect element according to the embodiment.
Figure 5B:
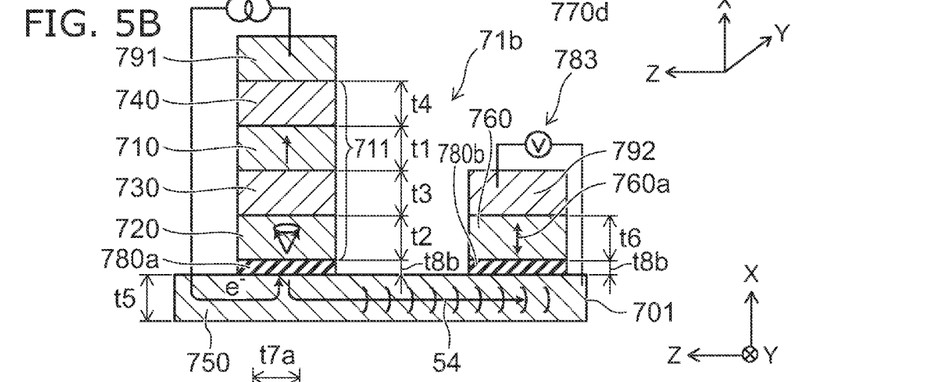
Figure 5C:
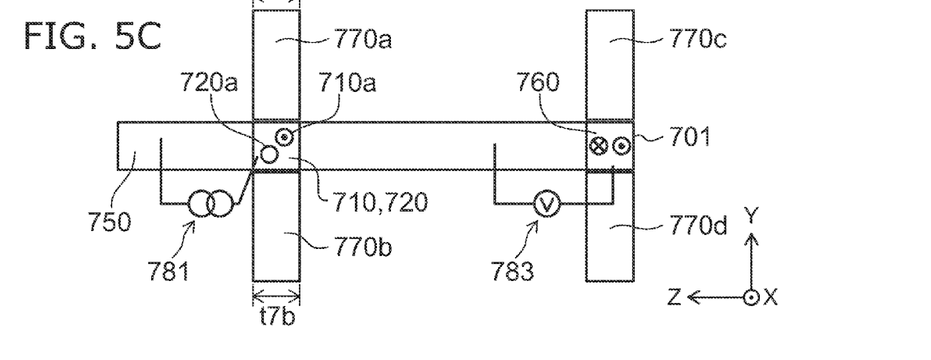

FIG. 5A to FIG. 5C are schematic views illustrating still another magnetoresistive effect element according to the embodiment.

FIG. 5A is a schematic perspective view. FIG. 5B is a cross-sectional view taken along line C1-C2 shown in FIG. 5A. FIG. 5C is a schematic plan view.

The direction of the second magnetization 720a is the same direction as the first magnetization 710a. In other words, the direction of the second magnetization 720a is parallel to the direction of the first magnetization 710a. At this time, "parallel" includes not only the case where the direction of the first magnetization 710a is strictly parallel to the direction of the second magnetization 720a but also the case where the angle between the direction of the first magnetization 710a and the direction of the second magnetization 720a is plus or minus 50 degrees or less.

In a magnetoresistive effect element 71b shown in FIG. 5A to FIG. 5C, the direction of the first magnetization 710a is parallel to the X-axis direction. The direction of the second magnetization 720a is parallel to the X-axis direction. The angle between the direction of the first magnetization 710a and the X-axis direction may be plus or minus 20 degrees or less, for example. The angle between the direction of the second magnetization 720a and the Y-axis direction may be plus or minus 20 degrees or less, for example.

However, the embodiment is not limited thereto, and the direction of the first magnetization 710a may be antiparallel to the X-axis direction, for example. The direction of the second magnetization 720a may be antiparallel to the X-axis direction, for example.

The magnetization easy axis 760a of the detection layer 760 is parallel to the X-axis direction. That is, the magnetization easy axis 760a of the detection layer 760 is parallel to the direction of the first magnetization 710a. The magnetization easy axis 760a of the detection layer 760 is parallel to the direction of the second magnetization 720a. At this time, "parallel" includes not only the case where the magnetization easy axis 760a is strictly parallel to the direction of the first magnetization 710a but also the case where the angle between the magnetization easy axis 760a and the direction of the first magnetization 710a is plus or minus 20 degrees or less. At this time, "parallel" includes not only the case where the magnetization easy axis 760a is strictly parallel to the direction of the second magnetization 720a but also the case where the angle between the magnetization easy axis 760a and the direction of the second magnetization 720a is plus or minus 20 degrees or less.

Otherwise, the magnetoresistive effect element 71b is similar to the magnetoresistive effect element 71a described above in regard to FIG. 4A to FIG. 4C.

Thereby, effects similar to the effects of the magnetoresistive effect element 71 described above in regard to FIG. 1A to FIG. 1C or the effects of the magnetoresistive effect element 71a described above in regard to FIG. 4A to FIG. 4C are obtained.

In the magnetoresistive effect element 71 described above in regard to FIG. 1A to FIG. 1C, the magnetoresistive effect element 71a described above in regard to FIG. 4A to FIG. 4C, and the magnetoresistive effect element 71b described above in regard to FIG. 5A to FIG. 5C, the detection layer 760 is provided on the first nonmagnetic layer 750 along the first direction (the X-axis direction). However, the detection layer 760 may be provided under the first nonmagnetic layer 750 along the first direction (the X-axis direction). In this case, the second interface layer 780b is provided under the first nonmagnetic layer 750 along the first direction (the X-axis direction). That is, the second interface layer 780b is provided between the first nonmagnetic layer 750 and the detection layer 760.

Figure 6:
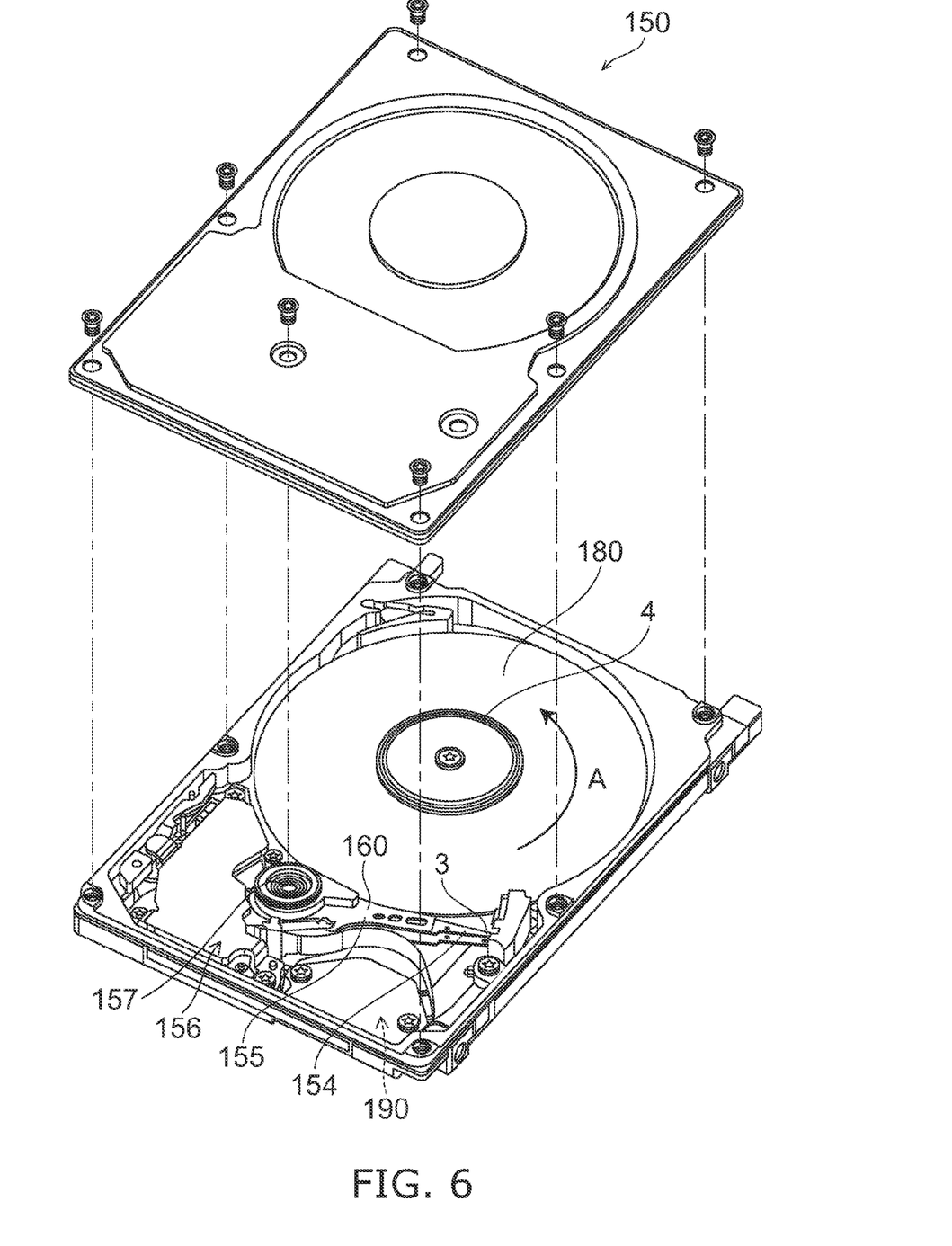
FIG. 6 is a schematic perspective view illustrating a magnetic recording and reproducing apparatus according to the embodiment.

FIG. 6 is a schematic perspective view illustrating a magnetic recording and reproducing apparatus according to the embodiment.

Figure 7A:
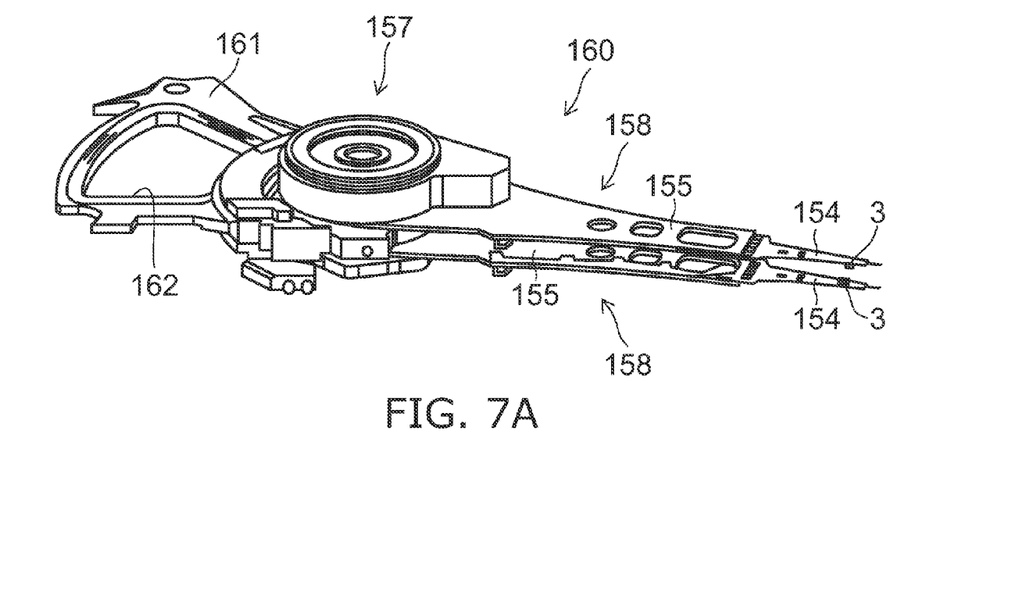
FIG. 7A and FIG. 7B are schematic perspective views illustrating part of a magnetic recording apparatus according to the embodiment.
Figure 7B:
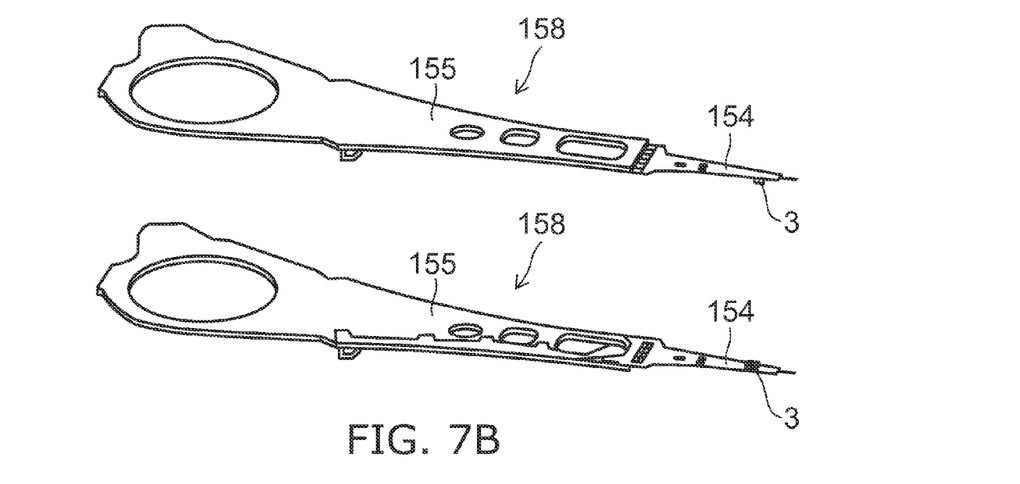

FIG. 7A and FIG. 7B are schematic perspective views illustrating part of a magnetic recording apparatus according to the embodiment.

As shown in FIG. 6, a magnetic recording and reproducing apparatus 150 according to the embodiment is an apparatus of a system using a rotary actuator. In the drawing, a recording medium disk 180 is mounted on a spindle motor 4, and is rotated in the direction of arrow A by a not-shown motor that responds to a control signal from a not-shown driving device control unit. The magnetic recording and reproducing apparatus 150 according to the embodiment may include a plurality of recording medium disks 180.

The head slider 3 that performs the recording and reproduction of information stored in the recording medium disk 180 has a configuration like that described above, and is provided at the tip of a suspension 154 in a thin film form. Here, the magnetic head 110 including one of the magnetoresistive effect elements according to the embodiments described above (e.g. the magnetoresistive effect elements 71, 71a, and 71b), for example, is mounted near the tip of the head slider 3.

When the recording medium disk 180 rotates, the pressing pressure by the suspension 154 and the pressure generated at the medium facing surface (ABS) of the head slider 3 are balanced, and the medium facing surface of the head slider 3 is held above the surface of the recording medium disk 180 with a prescribed flying height. Also what is called a "contact-traveling type" may be used in which the head slider 3 is in contact with the recording medium disk 180.

The suspension 154 is connected to one end of an actuator arm 155 including a bobbin that holds a not-shown driving coil or the like. A voice coil motor 156 that is a kind of linear motor is provided at the other end of the actuator arm 155. The voice coil motor 156 may include a not-shown driving coil wound around the bobbin of the actuator arm 155 and a magnetic circuit composed of a permanent magnet and an opposed yoke that are disposed to oppose each other across the coil.

The actuator arm 155 is held by not-shown ball bearings provided at two positions, the top and bottom, of a bearing portion 157, and can rotationally slide freely by means of the voice coil motor 156. Consequently, the magnetic head can be moved to an arbitrary position on the recording medium disk 180.

FIG. 7A illustrates part of the magnetic recording and reproducing apparatus, and is an enlarged perspective view of a head stack assembly 160.

FIG. 7B is a perspective view illustrating a magnetic head assembly (head gimbal assembly; HGA) 158 that is part of the head stack assembly 160.

As shown in FIG. 7A, the head stack assembly 160 includes the bearing portion 157, a head gimbal assembly 158 extending from the bearing portion 157, and a support frame 161 extending from the bearing portion 157 in the opposite direction to the HGA and supporting the coil 162 of the voice coil motor.

As shown in FIG. 7B, the head gimbal assembly 158 includes the actuator arm 155 extending from the bearing portion 157 and the suspension 154 extending from the actuator arm 155.

The head slider 3 is provided at the tip of the suspension 154. The magnetic head including one of the magnetoresistive effect elements according to the embodiments is mounted in the head slider 3.

That is, the magnetic head assembly (head gimbal assembly) 158 according to the embodiment includes the magnetic head according to the embodiment, the head slider 3 mounted with the magnetic head, the suspension 154 mounted with the head slider 3 at one end, and the actuator arm 155 connected to the other end of the suspension 154.

The suspension 154 includes lead wires (not shown) for writing and reading signals, for a heater for adjusting the flying height, for a spin torque oscillator, for example, and for other purposes. These lead wires and the respective electrodes of the magnetic head incorporated in the head slider 3 are electrically connected.

A signal processing unit 190 is provided that uses the magnetic head to perform the writing and reading of signals on the magnetic recording medium. The signal processing unit 190 is provided on the back side, in the drawing, of the magnetic recording and reproducing apparatus 150 illustrated in FIG. 6, for example. The input/output lines of the signal processing unit 190 are connected to the electrode pads of the head gimbal assembly 158 to be electrically connected to the magnetic head.

Thus, the magnetic recording and reproducing apparatus 150 according to the embodiment includes a magnetic recording medium, a magnetic head including the magnetoresistive effect element according to the embodiments mentioned above, a movable unit that allows the magnetic recording medium and the magnetic head to move relatively in a state of keeping both apart or in contact, a position control unit that positions the magnetic head at a prescribed recording position on the magnetic recording medium, and a signal processing unit that uses the magnetic head to perform the writing and reading of signals on the magnetic recording medium.

That is, the recording medium disk 180 is used as the magnetic recording medium mentioned above.

The movable unit mentioned above may include the head slider 3.

The position control unit mentioned above may include the head gimbal assembly 158.

Thus, the magnetic recording and reproducing apparatus 150 according to the embodiment includes a magnetic recording medium, the magnetic head assembly according to the embodiment, and a signal processing unit that uses the magnetic head mounted on the magnetic head assembly to perform the writing and reading of signals on the magnetic recording medium.

The magnetic recording and reproducing apparatus 150 according to the embodiment enables reproduction of high power and low resistance by using the magnetic head according to the embodiments mentioned above. Furthermore, spin torque noise is suppressed, the decrease in the S/N ratio due to thermal magnetic noise is suppressed, and space resolution can be improved.

The embodiment provides a magnetoresistive effect element, a magnetic head, and a magnetic recording and reproducing apparatus of high output voltage or high spin injection efficiency.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may appropriately select specific configurations of components of magnetic heads such as reproducing units, magnetoresistive effect elements, reference layers, oscillation layers, nonmagnetic layers, antiferromagnetic layers, detection layers, interface layers, and writing units, components of magnetic head assemblies such as head sliders, suspensions, and actuator arms, and components of magnetic recording and reproducing apparatuses such as magnetic recording media from known art and similarly practice the invention. Such practice is included in the scope of the invention to the extent that similar effects thereto are obtained. For example, the materials, compositions, film thicknesses, etc. described in the above embodiments are only examples and various selections are possible.

Further, any two or more components of the specific examples may be combined within the extent of technical feasibility and are included in the scope of the embodiments to the extent that the spirit of the embodiments is included.

Moreover, all magnetoresistive effect elements, magnetic heads, magnetic head assemblies, and magnetic recording and reproducing apparatuses practicable by an appropriate design modification by one skilled in the art based on the magnetoresistive effect elements, the magnetic heads, the magnetic head assemblies, and the magnetic recording and reproducing apparatuses described above as embodiments of the invention also are within the scope of the invention to the extent that the purport of the embodiments of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
    a nonmagnetic layer;
    a stacked structure body provided on the nonmagnetic layer and including:
        a reference layer provided on the nonmagnetic layer, a magnetization of the reference layer being fixed;
        an oscillation layer provided between the reference layer and the nonmagnetic layer, a magnetization of the oscillation layer being substantially parallel to the magnetization of the reference layer and being able to process; and
        an intermediate layer provided between the reference layer and the oscillation layer; and
    a detection layer provided on the nonmagnetic layer apart from the stacked structure body, the detection layer detecting magnetization.

2. The magnetoresistive effect element according to claim 1, wherein
    a magnetization of the detection layer is variable and
    an easy axis of the magnetization of the detection layer is substantially parallel to the magnetization of the reference layer.

3. The magnetoresistive effect element according to claim 1, wherein
    a magnetization of the detection layer is variable and
    an easy axis of the magnetization of the detection layer is substantially parallel to the magnetization of the oscillation layer.

4. The magnetoresistive effect element according to claim 1, wherein the magnetization of at least one of the reference layer and the oscillation layer is substantially perpendicular to a stacking direction of layers.

5. The magnetoresistive effect element according to claim 4, wherein the stacking direction of layers is a direction in that the reference layer and the oscillation layer are stacked.

6. The magnetoresistive effect element according to claim 1, wherein the magnetization of at least one of the reference layer and the oscillation layer is substantially parallel to a stacking direction of layers.

7. The magnetoresistive effect element according to claim 6, wherein the stacking direction of layers is a direction in that the reference layer and the oscillation layer are stacked.

8. The magnetoresistive effect element according to claim 1, further comprising:
    a first hard bias; and
    a second hard bias provided apart from the first hard bias, the stacked structure body being provided between the first hard bias and the second hard bias.

9. The magnetoresistive effect element according to claim 1, further comprising:
    a first hard bias; and
    a second hard bias provided apart from the first hard bias, the detection layer being provided between the first hard bias and the second hard bias.

10. The magnetoresistive effect element according to claim 1, wherein
    a product $Ms1 \times t1$ is larger than a product $Ms2 \times t2$,
    where $Ms1$ is a saturation magnetization of the reference layer, $t1$ is a thickness of the reference layer along a direction from the oscillation layer toward the reference layer, $Ms2$ is a saturation magnetization of the oscillation layer, and $t2$ is a thickness of the oscillation layer along a direction from the oscillation layer toward the reference layer.

11. The magnetoresistive effect element according to claim 1, wherein
    at least one of the reference layer, the oscillation layer, and the detection layer contains at least one of iron (Fe), cobalt (Co), nickel (Ni), an FeCo alloy, and an FeNi alloy.

12. The magnetoresistive effect element according to claim 1, wherein
    at least one of the reference layer, the oscillation layer, and the detection layer contains a ferromagnetic alloy containing cobalt (Co), the cobalt (Co) being added into at least one of iron (Fe), nickel (Ni), manganese (Mn), aluminum (Al), silicon (Si), and germanium (Ge).

13. The magnetoresistive effect element according to claim 1, wherein
    at least one of the reference layer, the oscillation layer, and the detection layer contains a ferromagnetic Heusler alloy, the ferromagnetic Heusler alloy being an average composition of the reference layer and containing $Co_2AB$,
    wherein A includes at least one of iron (Fe) and manganese (Mn), and
    wherein B includes at least one of aluminum (Al), silicon (Si), and germanium (Ge).

14. The magnetoresistive effect element according to claim 1, wherein the intermediate layer contains a metal selected from a group consisting of copper (Cu), silver (Ag), aluminum (Al), and gold (Au) or an alloy containing at least one element selected from the group.

15. The magnetoresistive effect element according to claim 1, wherein the nonmagnetic layer contains a metal selected from a group consisting of copper (Cu), silver (Ag), aluminum (Al), and gold (Au) or an alloy containing at least one element selected from the group.

16. The magnetoresistive effect element according to claim 1, further comprising:
   a first interface layer provided between the oscillation layer and the nonmagnetic layer and having a resistance higher than a resistance of the nonmagnetic layer; and
   a second interface layer provided between the detection layer and the nonmagnetic layer and having a resistance higher than a resistance of the nonmagnetic layer.

* * * * *